US006565304B2

(12) United States Patent
Martin et al.

(10) Patent No.: US 6,565,304 B2
(45) Date of Patent: May 20, 2003

(54) WAFER BOAT ELEVATOR SYSTEM AND METHOD

(75) Inventors: John M. Martin, Mesa, AZ (US); Arthur W. Harrison, Mesa, AZ (US); Allen D. Edwards, Phoenix, AZ (US)

(73) Assignee: Amtech Systems, Incorporated, Tempe, AZ (US)

( * ) Notice: Subject to any disclaimer, the term of this patent is extended or adjusted under 35 U.S.C. 154(b) by 58 days.

(21) Appl. No.: 09/859,567

(22) Filed: May 16, 2001

(65) Prior Publication Data
US 2002/0154970 A1 Oct. 24, 2002

Related U.S. Application Data
(60) Provisional application No. 60/285,823, filed on Apr. 24, 2001.

(51) Int. Cl.$^7$ ............................................. B65G 25/04
(52) U.S. Cl. ..................... 414/150; 414/156; 414/160
(58) Field of Search ................................. 414/160, 172, 414/180, 150, 156

(56) References Cited

U.S. PATENT DOCUMENTS

| | | | | |
|---|---|---|---|---|
| 4,287,967 A | | 9/1981 | Perkins | 187/24 |
| 4,640,214 A | | 2/1987 | Bruns | 114/263 |
| 4,726,316 A | | 2/1988 | Bruns | 114/263 |
| 4,752,219 A | * | 6/1988 | Fisher, Jr. | 432/253 |
| 4,872,799 A | * | 10/1989 | Fisher, Jr. | 414/180 |
| 4,888,994 A | | 12/1989 | Nakamaki et al. | 73/760 |
| 4,955,808 A | * | 9/1990 | Miyagawa | 432/5 |
| 5,030,057 A | | 7/1991 | Nishi et al. | 414/786 |
| 5,069,591 A | | 12/1991 | Kinoshita | 414/156 |
| 5,765,982 A | | 6/1998 | Martin et al. | 414/156 |
| 5,915,913 A | | 6/1999 | Greenlaw et al. | 414/679 |

OTHER PUBLICATIONS

IBM Tech Disclosure NN 8606327, Jun. 1986.*

* cited by examiner

Primary Examiner—Steven A. Bratlie
(74) Attorney, Agent, or Firm—Cahill, von Hellens & Glazer P.L.C.

(57) ABSTRACT

An apparatus for assisting the loading of a plurality of wafer boats into a multi-level wafer boat loading system (1) includes a vertical elevator mechanism (10) attached to the wafer boat loading system (1). A vertically movable horizontal wafer boat platform (18B) is attached to a vertically movable carriage (31) included in the elevator mechanism and vertically movable along a linear track (30) therein. A control system (25) associated with the vertical elevator mechanism includes a processor for executing a stored program which stores information representing a plurality of elevation levels the plurality of cantilever paddles (5), respectively, and which responds to a selection signal corresponding to manual selection of one of the elevator levels to control a drive mechanism (22,27) which moves the wafer boat support platform (18B) from an initial position to the selected elevator level. Each of a plurality of heat shield devices (50) includes a heat reflector plate (51) that is movable in response to a controller (75) to advance the heat reflector plate (51) in front of a scavenger opening to prevent excessive heating in the boat loading region during wafer boat loading/unloading operations.

16 Claims, 7 Drawing Sheets

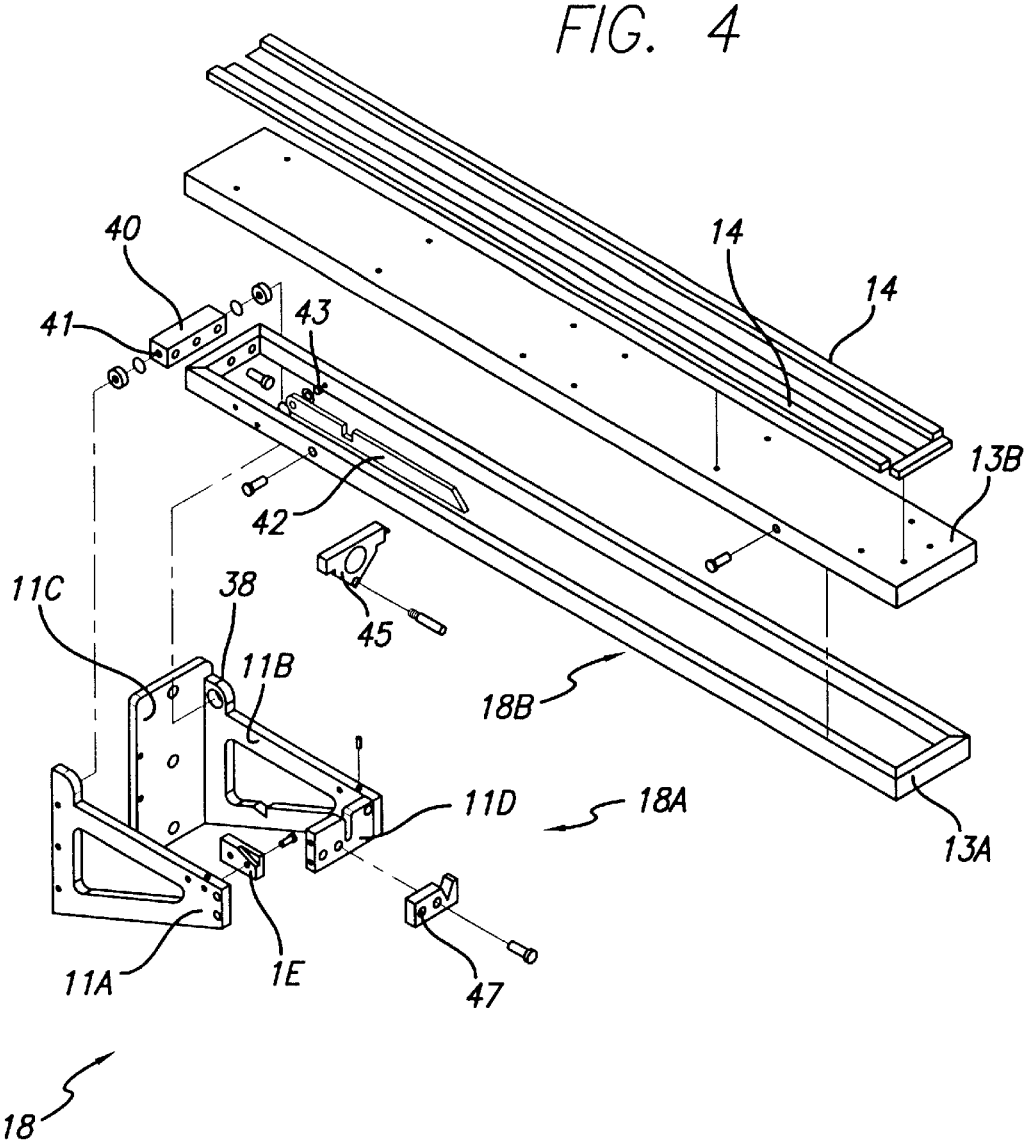

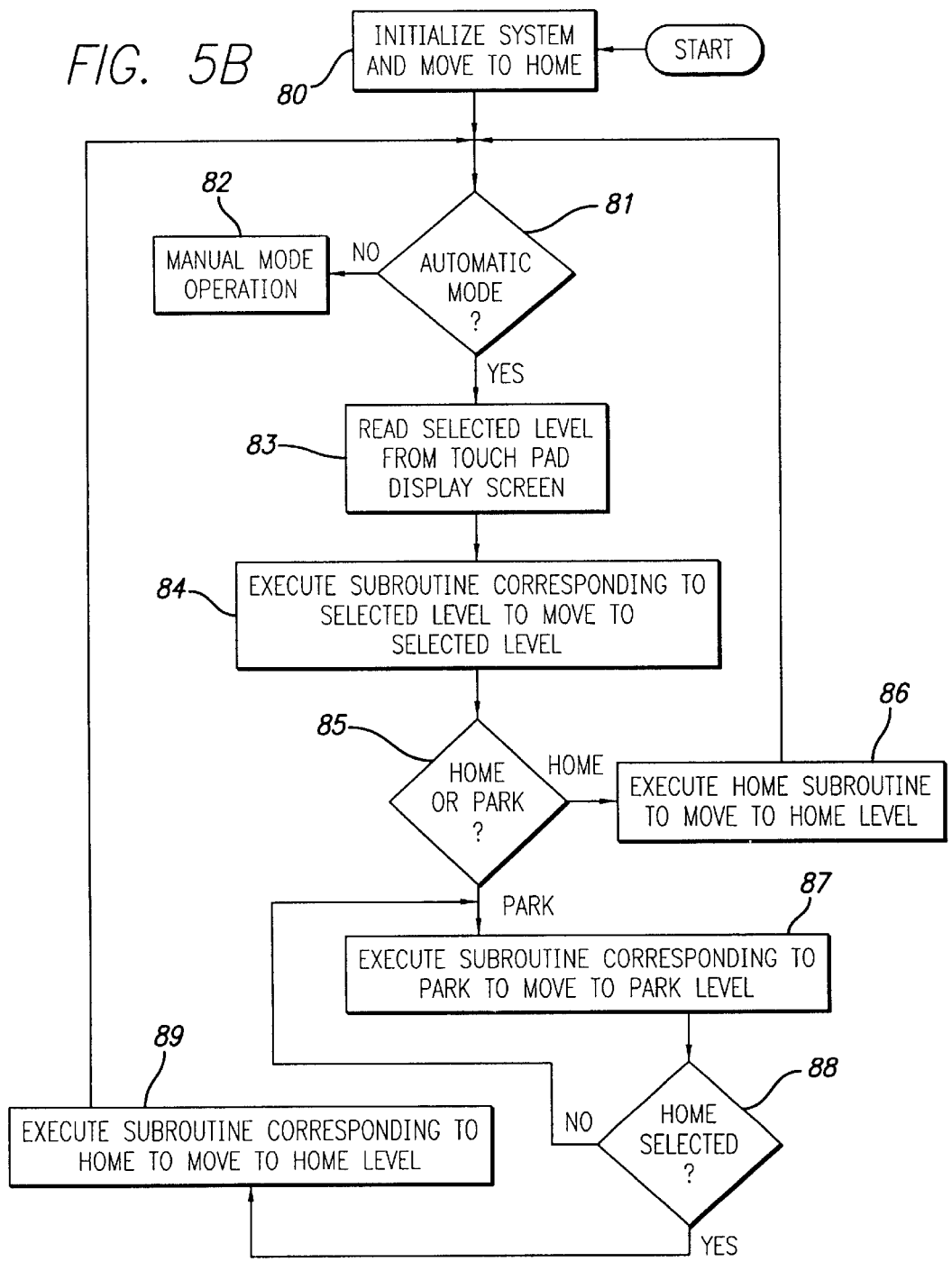

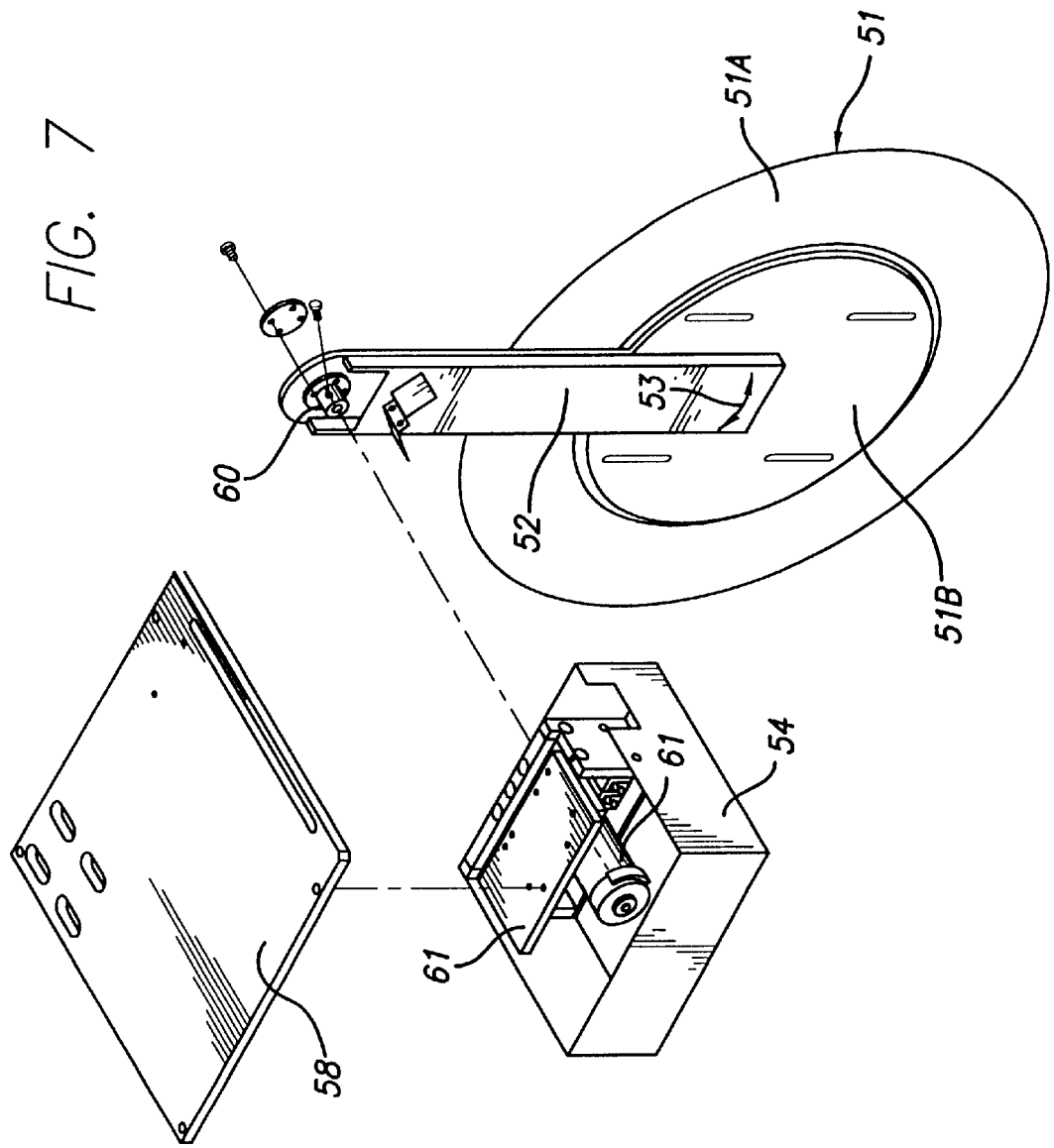

WAFER BOAT ELEVATOR SYSTEM AND METHOD

CROSS-REFERENCE TO RELATED APPLICATION

This application claims the benefit of prior filed co-pending U.S. provisional application Docket No. 2374-P-19, Serial No. 60/285,823 filed Apr. 24, 2001, entitled "IMPROVED WAFER BOAT ELEVATOR SYSTEM AND METHOD" by contributors John M. Martin, Arthur W. Harrison, and Allen D. Edwards.

BACKGROUND OF THE INVENTION

The invention relates to an inexpensive, simplified, mostly manual system for loading a plurality of boat loads of semiconductor wafers into a plurality of furnace tube is of a multi-level semiconductor processing furnace, and also to simultaneously protecting the wafer loading region from excessive heat emanating from open ends of the furnace tubes.

Commonly assigned U.S. Pat. No. 5,765,982 by Martin et al., issued Jun. 16, 1998 discloses an example of a fully automated prior art wafer boat loading/unloading system. FIG. 1A of U.S. Pat. No. 5,765,982 shows a complex loading station for a semiconductor processing furnace. A queue mechanism 30 having a stationary base is loaded with up to eight boatloads of semiconductor wafers. The queue mechanism shifts the right hand boatload of wafers to an index position at the right end of queue mechanism such that a pair of horizontal elevator tines of a vertical elevator mechanism can pick up one boatload of wafers at a time in the manner of a fork lift, and raise them upward and into alignment with one of a number of horizontal loading assemblies. Each loading assembly includes a carriage which moves horizontally on a track toward a semiconductor furnace tube located in a furnace cabinet on the right hand side of the furnace loading station so that up to eight boatloads of wafers supported on a horizontal cantilever paddle can be inserted into the hot zone of a corresponding furnace tube. A horizontal robotic mechanism is supported by vertical elevator. The horizontal robotic mechanism supports the tines which pick up one boatload of wafers and moves them horizontally to position each boatload of wafers, one at a time, over the paddle and lower it onto the paddle. After up to eight boatloads of wafers have been loaded onto cantilever paddle, the carriage supporting the paddle moves into the hot zone of the corresponding furnace tube. The entire operation is controlled by a controller 25 and an associated control console 15 which is mounted as shown. The foregoing system of U.S. Pat. No. 5,765,982 is very expensive.

The known fully automated wafer boat loading systems constitute one extreme of the prior art, and have been widely adopted by the larger semiconductor wafer fabrication concerns. The other extreme of the prior art constitutes manually loading/unloading all of the wafer boats, one at a time, wherein a worker, referred to as an operator, carries each wafer boat up or down a stepladder, supporting the loaded wafer boat by means of a conventional hand-held, fork-shaped "pickup tool". This process is relatively inexpensive in that it requires very little capital investment, and is still widely used by smaller semiconductor wafer processing concerns. However, the fully manual loading/unloading technique has the shortcomings of being very stressful and dangerous for the operators, because each loaded standard wafer boat is very heavy.

The manual wafer boat loading/unloading technique also has the shortcoming that it puts the very valuable work product, i.e., the partially processed semiconductor wafers, at risk. One reason for this shortcoming is that if the operator becomes unsteady on the stepladder and drops a wafer boat, the economic loss is likely to be very high, perhaps many thousands of dollars. Another reason for the shortcoming is that during a completely manual wafer boat loading process, there is a substantial risk that the operator may mistakenly place one or more loaded wafer boats on the wrong cantilever paddle, which usually means that wafer boat gets loaded in the wrong processing furnace. Since different furnaces in the same multi-level rack of furnace tubes may be performing different processes, this mistake can destroy or result in a great loss of value of the in-process wafers.

It has long been known that most common injuries to operators performing fully manual wafer boat loading/unloading operations involve stumbling on the ladder steps or falling off of the ladder. The risk of this kind injury is greatly exacerbated by the substantial weight and precariousness of a boatload of wafers being held by means of a pickup tool and by the large amount of attention required to be focused by the operator on the task of maintaining stability of the boatload of wafers while climbing up or down the stepladder. The balancing act which the operator has to perform detracts substantially from the attention that needs to be given to safely climbing up and down the stepladder while supporting the wafer boat completely level.

Although the completely manual wafer boat loading technique and the automated wafer boat loading techniques have been known to those skilled in the art for many years, no one has ever provided a practical solution to the above described shortcomings of completely manual wafer boat loading/unloading processes other than to provide the above described automated wafer boat loading/unloading systems, which are very expensive.

Thus, there has long been an unmet need for a wafer boat loading system which is less costly than the highly automated systems of the prior art, and which is substantially safer than the known technique of manually carrying wafer boats up and down a stepladder to the higher cantilever paddles and placing the wafer boats thereon by means of a pickup tool.

Another problem associated with most, if not all, wafer boat loading/unloading techniques is that typically the temperatures within the furnace tubes often are from about 400 degrees to 1200 degrees Centigrade. Enough heat flows out of the mouths of the furnace tubes and through the adjacent openings of the scavenger device disposed between the furnace and the wafer boat loading station to cause the temperature in the vicinity of the wafer boat loading station to be too high for maintenance personnel, and also too high for operators who place wafer boats on the receiving queue or platform of the wafer boat loading station. When the temperature in the furnace tube reaches about 500 degrees Centigrade, then the region outside the furnace to mouth may become hot enough tube cause problems for control circuitry located in the region. One reason for this is that some transistors and sensing devices can not tolerate such high temperatures. For example, some integrated circuits that might be used in automatic wafer boat loading systems must be operated below 80 degrees Centigrade.

In the past, furnace tube caps have been used to seal the open mouths of semiconductor processing furnace tubes during processing of semiconductor wafers therein, but no practical technique has been provided for preventing heat from escaping through the open mouths of the furnace tubes and associated scavenger devices during wafer boat loading and unloading procedures.

Thus, there has been an unmet need for an apparatus and technique for preventing loss of heat through the mouth of a furnace tube and through an associated scavenger device into the working region of a multi-level wafer boat loading system, and for keeping the temperature in the working region low enough to be suitable for maintenance personnel and low enough to be suitable for operation of control circuitry associated with the wafer boat loading system.

SUMMARY OF THE INVENTION

Accordingly, it is an object of the invention to provide a simplified wafer boat loading device which reduces the amount of physical effort required for an operator to manually load/unload boatloads of semiconductor wafers into/from a multi-level semiconductor processing furnace.

It is another object of the invention to provide a wafer boat loading device which reduces the likelihood of physical injury to an operator who manually loads/unloads boatloads of semiconductor wafers into/from multi-level semiconductor processing furnaces.

It is another object of the invention to provide a simplified wafer boat loading system which requires a minimum amount of space in the vicinity of a multi-level wafer boat loading system.

It is another object of the invention to avoid the instability that results when an operator carries a boatload of semiconductor wafers up or down a ladder, using a conventional pickup tool.

It is another object of the invention to avoid operator fatigue resulting from carrying boatloads of semiconductor wafers up and down a stepladder to accomplish loading/unloading the boatloads of semiconductor wafers into/from a processing furnace.

It is another object of the invention to avoid the high cost of providing an automated semiconductor wafer boat loading system to solve the known problems associated with manual loading/unloading of semiconductor wafer boats to/from a cantilever paddle of a multi-level wafer boat loading station.

It is another object of the invention to avoid errors wherein an operator inadvertently loads a boatload of semiconductor wafers onto the wrong cantilever paddle of a multi-level wafer boat loading system.

It is another object of the invention to protect components of a wafer boat loading system from heat escaping through the mouth of a multi-level furnace and associated scavenger device during wafer boat loading/unloading operations.

It is another object of the invention to provide a wafer boat loading device which avoids injuries to operators due to repetitive motion, and meets OSHA standards for ergonomic devices.

Briefly described, and in accordance with one embodiment thereof, the invention provides an apparatus for assisting the loading of a plurality of wafer boats into a multi-level furnace (70) including a vertical arrangement of horizontal furnace tubes (71), by means of a multi-level wafer boat loading system (1) including a vertical arrangement of a plurality of horizontal cantilever paddles (5) supported by a plurality of the corresponding carriages (3) movable along corresponding horizontal tracks (4). A vertical elevator mechanism (10) is attached in fixed relationship to the wafer boat loading system (1). A vertically movable horizontal wafer boat platform (18B) is attached to a vertically movable carriage (31) which is included in the elevator mechanism and is vertically movable along a linear track (30) in the elevator mechanism in response to an electrical drive mechanism (22,27). A controller (25) for controlling the vertical elevator mechanism includes a memory storing a program and a processor coupled to the memory for executing the program to control the elevation of the platform (18B). The program is configured to store information representing a plurality of elevation levels of the wafer boat support platform (18B) adjacent to the plurality of cantilever paddles (5), respectively.

The program also is configured to receive a selection signal produced by manual selection of one of the elevator levels and to control the electrical drive mechanism (22,27) in response to the selection signal to move the wafer boat support platform (18B) from an initial position to the selected elevator level. The program is configured to receive manually entered information representing a plurality of elevation levels and to store the plurality of elevation levels in the memory. The controller (25) includes a touch pad display screen (16) adapted to display distinct touch pad areas corresponding to the elevation levels, respectively and produce the selection signal in response to pressing of one of the touch pad areas. The program also is configured to store information representing a home elevation of the wafer boat platform (18B) at a level which is safe and convenient for manual placing of the wafer boats, loaded with semiconductor wafers, on the wafer boat support platform (18B). The program also is configured to receive a home selection signal corresponding to manual selection of the home elevation. In one described embodiment, a scavenger device in communication with the multilevel furnace (70) includes a plurality of heat shield devices (50) each including a heat reflector plate (51) attached to a movable arm (52). The movable arm is attached to a carriage mechanism (56) and movable in response to a drive mechanism (54). A controller is operable in response to a first control signal to advance the heat reflector plate (51) in front of an opening (73) of the scavenger device adjacent to a mouth of a corresponding furnace tube (71) when the corresponding carriage supporting the cantilever paddle is in its "home" position. The control system also is operable in response to a second control signal to withdraw the heat reflector plate (51) from the opening (73) of the scavenger device to allow entry of the cantilever paddle into the interior of the furnace tube when the carriage supporting the cantilever paddle moves away from its home position toward the opening (73) of the scavenger device (72).

BRIEF DESCRIPTION OF THE DRAWINGS

FIG. 4 is an exploded perspective view of the platform assembly 18 of elevator system 10 shown in FIG. 1.

FIG. 5A is a block diagram of controller 25 of FIG. 3.

FIG. 5B is a flowchart of the program executed by the controller 25.

FIG. 7 is an exploded perspective view of another automatic heat blocking mechanism for blocking heat from the mouth of furnace tube during operation of the elevator system of the present invention.

DETAILED DESCRIPTION OF THE PREFERRED EMBODIMENTS

Figure 1:
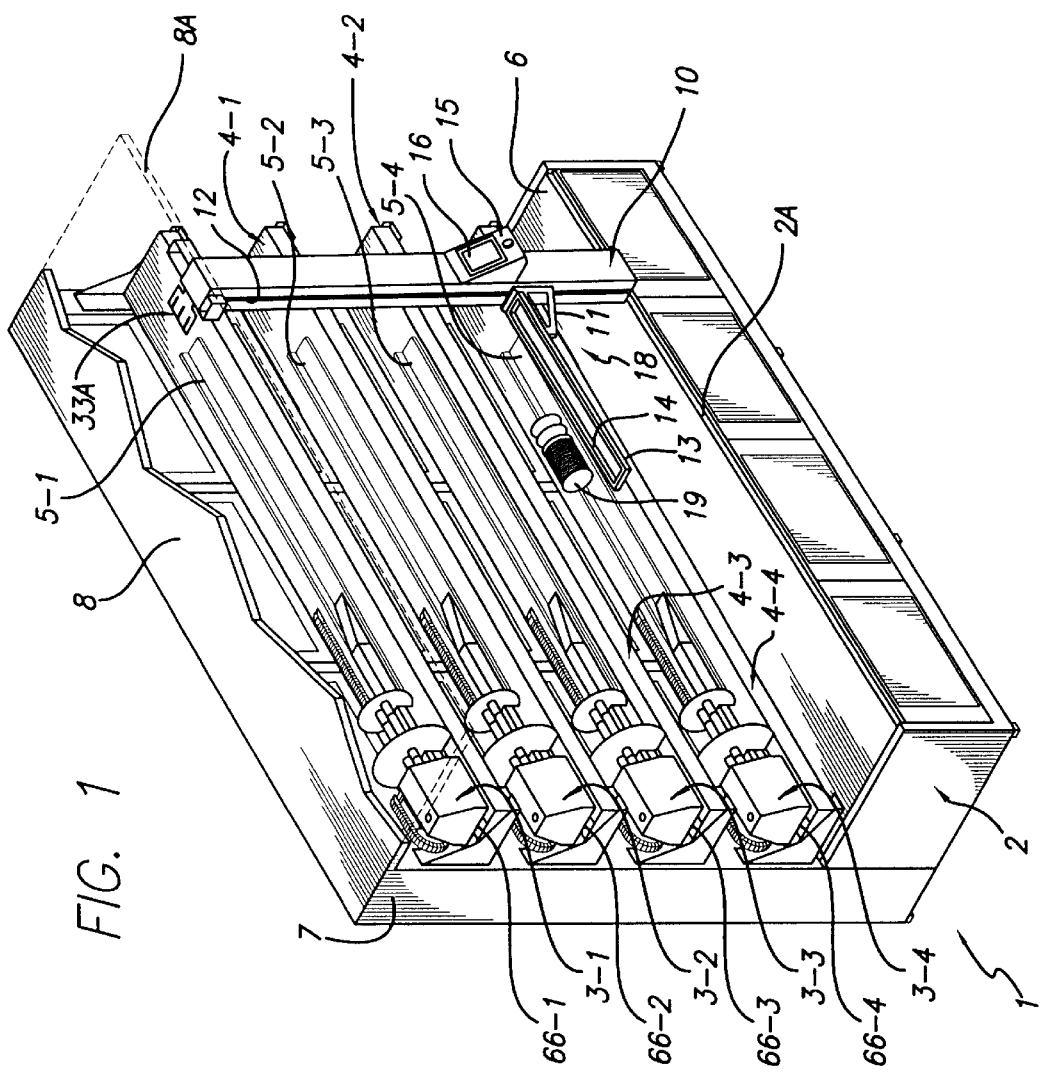
FIG. 1 is a partial cutaway perspective view of a four-level wafer boat loading/unloading station for loading wafer boats into a semiconductor processing furnace and unloading wafer boats from the semiconductor processing furnace, with the elevator system 10 of the present invention attached.

Referring to FIG. 1, wafer boat loading/unloading station 1 (hereinafter referred to simply as "wafer boat loading station 1") includes four conventional cantilevered wafer boat loading/unloading mechanisms 3-1, 3-2, 3-3 and 3-4 (hereinafter referred to simply as "loading mechanisms"), similar to those described in above mentioned U.S. Pat. No. 5,765,982. (Note that hereinafter, mechanisms 3-1, 3-2, 3-3 and 3-4 may be designated collectively as 3-1,2,3,4, and also may be collectively designated simply as loading mechanisms 3.) The same convention is used for various other elements described herein.) Each loading mechanism 3-1,2, 3,4 includes a carriage horizontally moveable on a longitudinal track 4-1,2,3,4, respectively. Each loading mechanism 3-1,2,3,4 supports a horizontal cantilever paddle 5-1,2,3,4 that supports up to eight "standard" wafer boats loaded with semiconductor wafers (i.e., up to about 300 wafers). In FIG. 1, a boatload of semiconductor wafers 19 is shown on cantilever paddle 5-1, ready to be carried into the hot zone of a semiconductor processing furnace tube 71-1 (see FIG. 8) by cantilever paddle 5-1. (Alternatively, a single, much larger wafer boat of the kind commonly referred to as a "long boat", rather than up to eight "standard" wafer boats, can be supported on a cantilever paddle and carried by it into the hot zone of the furnace tube.)

Wafer boat loading/unloading station 1 includes a base 2 having a front edge 2A, and a top cover 8 having a front edge 8A. A four-level elevator 10 has its lower end rigidly attached to the front edge 2A of base 2 and its upper end rigidly attached to the front edge 8A of the top cover 8. Elevator 10 supports a cantilever wafer boat platform assembly 18 and automatically carries up to eight standard boatloads of wafers up from a "HOME" elevation to a selected one of four predetermined elevations (referred to as LEVEL1, LEVEL2, LEVEL3, and LEVEL4) immediately adjacent to each of the four cantilever paddles 5-1,2,3,4, respectively, in response to pressing a corresponding touch pad area on a touch pad display screen 16 of a control console 15 attached to the front surface of elevator 10.

Figure 2:
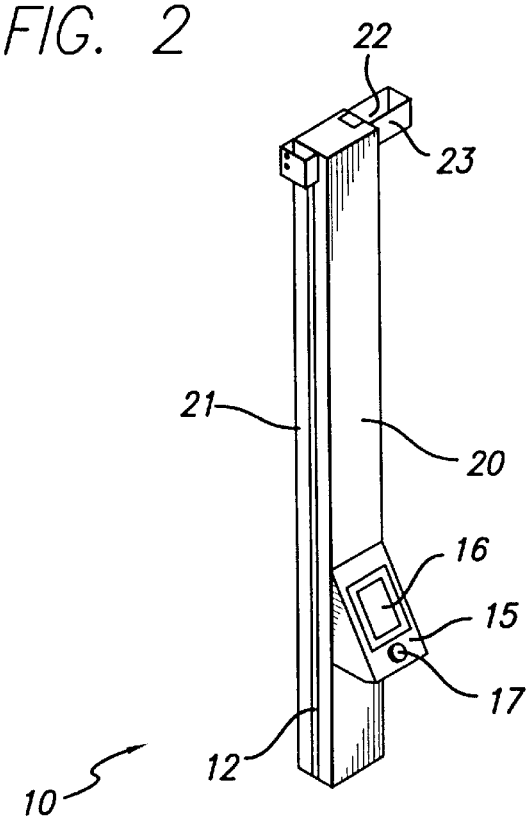
FIG. 2 is a perspective view of part of the assembled elevator system 10 shown in FIG. 1.

Referring also to FIG. 2, elevator 10 includes a front cover panel 20 and control console 15 mounted on front cover panel 20 as shown. Elevator 10 also includes a rear cover panel 21. A vertical slot 12 is provided on either the right side or left side of elevator 10 between the side edges of front cover panel 20 and cover panel 21. A bracket of the carriage 31 (FIG. 3) extends out of slot 12 and is attached to support wafer boat platform assembly 18 on which the wafer boats are manually placed.

Figure 3:
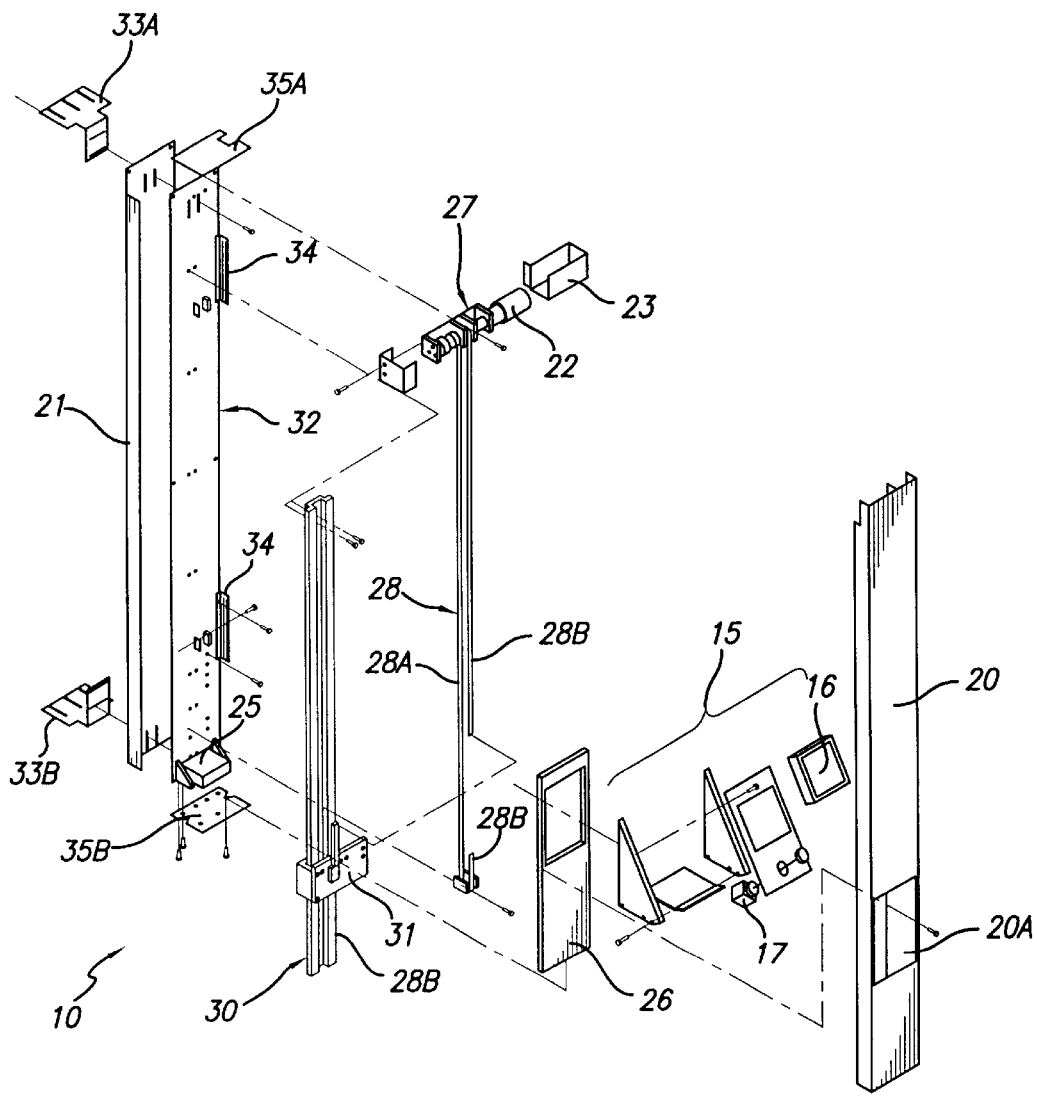
FIG. 3 is an exploded perspective view of the part of the elevator system 10 shown in FIG. 2.

Referring to FIG. 3, which is an exploded perspective view of elevator 10 (without the wafer boat support platform assembly 18), a vertical track 30 is rigidly attached to a vertical elongated backplate 32. The above mentioned carriage 31 moves along vertical track 30, supported by a chain 28 driven by a servo motor assembly 22 and a sprocket assembly 27, which are similar to those in the assignee's commercially available IBAL system. Servo motor assembly 22 is enclosed within a housing 23. Chain 28 includes a left section 28A that extends between sprocket assembly 27 and a stationary idler sprocket 29 which is attached to backplate 32. Chain 28 also includes a right section 28B having an upper portion that is attached to carriage 31 and a lower portion that is also attached to carriage 31, so that servo motor assembly 22 and sprocket assembly 27 operate under the control of a controller 25 to raise or lower carriage 31, and with it, wafer boat support platform assembly 18, which is rigidly attached to and supported by carriage 31. Controller 25 is supported by bottom plate 35B, and causes wafer boat support platform assembly 18 to be moved vertically to the elevation of a selected one of four levels adjacent to the four cantilever paddles 5-1, 5-2, 5-3, or 5-4. This selection is accomplished by the operator by pressing a corresponding touch pad area of display screen 16.

The above mentioned backplate 32 is rigidly attached to rear cover plate 21 and to brackets 33A and 33B, which are utilized to attach the upper and lower ends of elevator 10 to the front edge 8A of top cover 8 of wafer boat loading station 1 and to the front edge 2A of base 2.

Control console mounting plate 26 is rigidly attached to bottom plate 35B, which is attached to backplate 32. Control console 15 supports touch pad display screen 16 and switch 17, which are coupled to controller 25. Switch 17 functions as a power on/off switch and as an emergency stop switch.

The touch pad display screen 16 in FIGS. 1–3 can display indicia representing the four above mentioned selectable elevations of wafer boat support platform assembly 18. The four intended elevations are referred to as "LEVEL1", LEVEL2, LEVEL3, and LEVEL4, wherein LEVEL1 is the top level and LEVEL4 the bottom level. Touch pad display screen 16 also can display two additional elevations referred to as "HOME" and "PARK", and also can display a "STOP" command.

The touch pad display screen 16 also can display a numeric keypad by means of which the values of the four different elevations and the PARK and HOME elevations can be entered and stored by controller 25.

As shown in FIG. 1, elevator 10 has attached thereto the above mentioned cantilever wafer boat support platform assembly 18, which is adapted to support up to eight standard wafer boats or one long wafer boat. An exploded view of wafer boat support platform assembly 18 is shown in FIG. 4.

Referring to FIG. 4, cantilever wafer boat platform assembly 18 includes a bracket 18A including two parallel vertical brace members 11A and 11B The vertical rear edges of brace members 11A and 11B are attached to a vertical backplate 11C, which is attached by means of screws, as illustrated, to the vertical edge of the portion of carriage 31 extending through slot 12. The vertical front edges of brace members 11A and 11B are rigidly attached to a vertical front plate 11D. Cantilever wafer boat platform assembly 18 also includes a wafer boat support platform 18B including an elongated rectangular frame 13A supporting a matching plate 13B. A horizontal pivot block 40 is attached to the rear edges of frame 13A. A pivot pin 41 extends through opposite ends of pivot block 40 into suitable bushings which are supported in a pair of bearing holes 38 disposed in the upper, inner, rear portions of brace members 11A and 11B, as shown.

The foregoing pivot mechanism allows platform 18B to be pivoted from a horizontal position, wherein the bottom of frame 13A is supported by the upper edges of brace members 11A and 11B, to a vertical position (if no wafer boats are supported thereby), in order to allow better access to the cantilever paddles 5-1,2,3,4. A kickstand 42 is pivotally attached to the side rails of frame 13A. The outer end of kickstand 42 engages a notch in element 1E, which is rigidly attached to the inner face of vertical front plate 11D, in order to retain wafer boat support platform 18B in its vertical position.

A set of wafer boat support rails 14 are attached to the upper surface of plate 13B to support various types of wafer boats that can be loaded onto platform 18B. Preferably, plate 13B and rails 14 are composed of suitable high-temperature materials, such as stainless steel, silicon carbide, high-temperature polyamide, or the like.

Referring to FIG. 5A, controller 25 is provided on a small printed circuit board including a programmable logic controller integrated circuit which includes memory. Prototypes of the present invention have been implemented by means of a commercially available (AROMAT FP0) programmable logic controller including five kilobytes of memory. Controller 25 includes a bidirectional bus coupling it to touch pad display screen 16 and switch 17.

Controller 25 executes a program in accordance with the flowchart shown in FIG. 5B. Referring to FIG. 5B, the program first enters block 80 and performs various conventional initialization procedures and also executes a subroutine to move wafer boat platform assembly 18 to its HOME position, which is a an ergonomically acceptable elevation at which operators can conveniently and safely place wafer boats on wafer boat support platform 18B. The program then goes to decision block 81 and determines whether controller 25 is to operate in a completely manual mode or in an automatic mode. If the determination of decision block 81 is negative, the program executes a subroutine (not described herein) to control the elevation of wafer boat platform assembly 18 in response to pressing appropriate touch pad areas displayed on touch pad display screen 16. Otherwise, the program goes to block 83, and displays an appropriate touch pad area (described hereinafter), and prompts the operator to touch the appropriate displayed touch pad area, and determines or reads the selected, i.e., desired, level for wafer boat platform assembly 18 from the touch pad display screen 16.

The program then goes to block 84 and executes a subroutine corresponding to the desired level so as to move wafer boat platform assembly 18 to that level. The program then goes to decision block 85 and determines if wafer boat platform assembly 18 is at either the HOME level or the PARK level. If it is at the HOME" level, the program goes to block 86 and executes the HOME subroutine so as to move wafer boat platform assembly 18 to the HOME level, and returns to the entry point of decision block 81.

If the determination of decision block 85 is that wafer boat platform assembly 18 is at the PARK level, then the program goes to block 87 and executes a PARK subroutine so as to move wafer boat platform assembly 18 to the PARK level. The program then goes to decision block 88 and determines if the operator has selected the HOME level by pressing a corresponding displayed touch pad area on touch pad display screen 16. If the determination is negative, the program returns to the entry point of block 87, but if the determination is affirmative, the program goes to block 89 and executes the HOME subroutine so as to cause elevator 10 to move wafer boat platform assembly 18 to the HOME level, and then returns to the entry point of decision block 81. (A specific list of program instructions for a particular processor or programmable logic controller to implement the flowchart of FIG. 5B, including providing various appropriate status messages and user prompting messages, can be readily provided by one skilled in the art.)

When the controller 25 of elevator 10 is initially turned on, touch pad display screen 16 displays eight rectangular touch pad areas. Touch pad display screen 16 also displays the legends LEVEL1, LEVEL2, LEVEL3, LEVEL4, HOME, PARK, MANUAL MODE, and EXIT within the eight rectangular touch pad areas, respectively. If the operator then presses the touch pad area displaying LEVEL1, touch pad display screen 16 changes the display, which then displays two rectangular touch pad areas, one displaying the message "MOVING TO LEVEL1", and the other displaying STOP. Elevator 10 then automatically carries the wafer boat loads of semiconductor wafers to be processed (which have been previously placed on rails 14 of wafer boat support platform 18B) to an elevation immediately adjacent to the cantilever paddle 5-1, i.e., to LEVEL1. Then touch pad display 16 displays a rectangular information area containing the message "READY FOR LEVEL1 PRODUCT TRANSFER", and also displays two rectangular touch pad areas including the legends HOME and PARK, respectively.

If the operator presses the touch pad area displaying HOME, touch pad display screen 16 displays a rectangular message area containing the message "RETURNING TO HOME" and a rectangular touch pad area displaying STOP. When elevator 10 has completed returning wafer boat support platform 18B to the HOME elevation at which wafer boats are loaded onto and unloaded from platform 18B, touch pad display screen 16 displays a rectangular message area containing the message "SYSTEM AT HOME POSITION", and also displays a touch pad area displaying EXIT. If the operator presses the touch pad area displaying EXIT, touch pad display screen 16 displays the eight touch pad areas first described above. If the operator then presses the touch pad area displaying PARK, elevator 10 moves wafer boat support platform 18B to a PARK level located above the top level (LEVEL1) and touch pad display screen 16 simultaneously displays the message "MOVING TO PARK POSITION" and a touch pad area displaying STOP. (The PARK level allows wafer boat platform assembly 18 to be moved to a location above the other previously described levels, so as to get it out of the way of operators or maintenance personnel who need access to the cantilever paddles 5, carriages 3 etc.)

To operate the elevator 10 in conjunction with the multi-level wafer boat loading system 1 shown in FIG. 1, an operator uses the above mentioned "pickup device" to manually place the wafer boats on wafer boat support platform 18B when the elevator is in the "HOME" position. With the control controller 25 and touch pad display screen 16 turned on, the operator then presses the appropriate touch pad displayed on touch pad display screen 16 to indicate the desired level number (meaning the level of cantilever paddle 5-1, 5-2, 5-3, or 5-4 onto which the boatloads of wafers presently on wafer boat support platform 18B are to be manually transferred). The elevator 10 then is automatically operated by controller 25 to raise the wafer boat support platform 18A and the boatloads of wafers thereon to the selected level (LEVEL1, LEVEL2, LEVEL3 or LEVEL4) of the cantilever paddle on which the boatloads of wafers are to be loaded.

To load wafer boats onto the cantilever paddles of the higher levels of wafer boat loading station 1, e.g. for LEVEL1 and LEVEL 2, after the operator has manually placed up to eight standard wafer boats on wafer boat support platform 18B and has pressed a touch pad area indicating LEVEL1 or LEVEL2, the operator then climbs up a stepladder, carrying only a pickup device, and uses the pickup device to transfer the loaded wafer boats, one at a time, from wafer boat support platform 18B to the adjacent cantilever paddle at the selected level.

The invention described above provides a practical solution to the above described problems of fully manual wafer boat loading techniques involving use of a stepladder to manually carry wafer boats to the upper cantilever paddles in multi-level wafer boat loading systems (the problems referred to including operator injuries, risk of damage to partially processed semiconductor wafers, and the risk of operator error in loading wafer boats into the wrong semiconductor processing furnaces). The operator needs only to carry the small, light wafer boat pickup device up the ladder, and the elevator automatically carries the loaded wafer boats unerringly to the selected level of the correct cantilever paddle. Therefore, the operator is unlikely to inadvertently carry a loaded wafer boat up the stepladder and accidentally place it on the wrong cantilever paddle. The speed of loading/unloading wafer boats onto/from cantilever paddles by a skilled operator using the above described elevator system 10 is approximately the same as the speed of a typical fully automated wafer boat loading/unloading system. However, the cost of the elevator assembly 10 to customers is only about a third of the cost of a conventional fully automatic wafer boat loading station.

Figure 8:
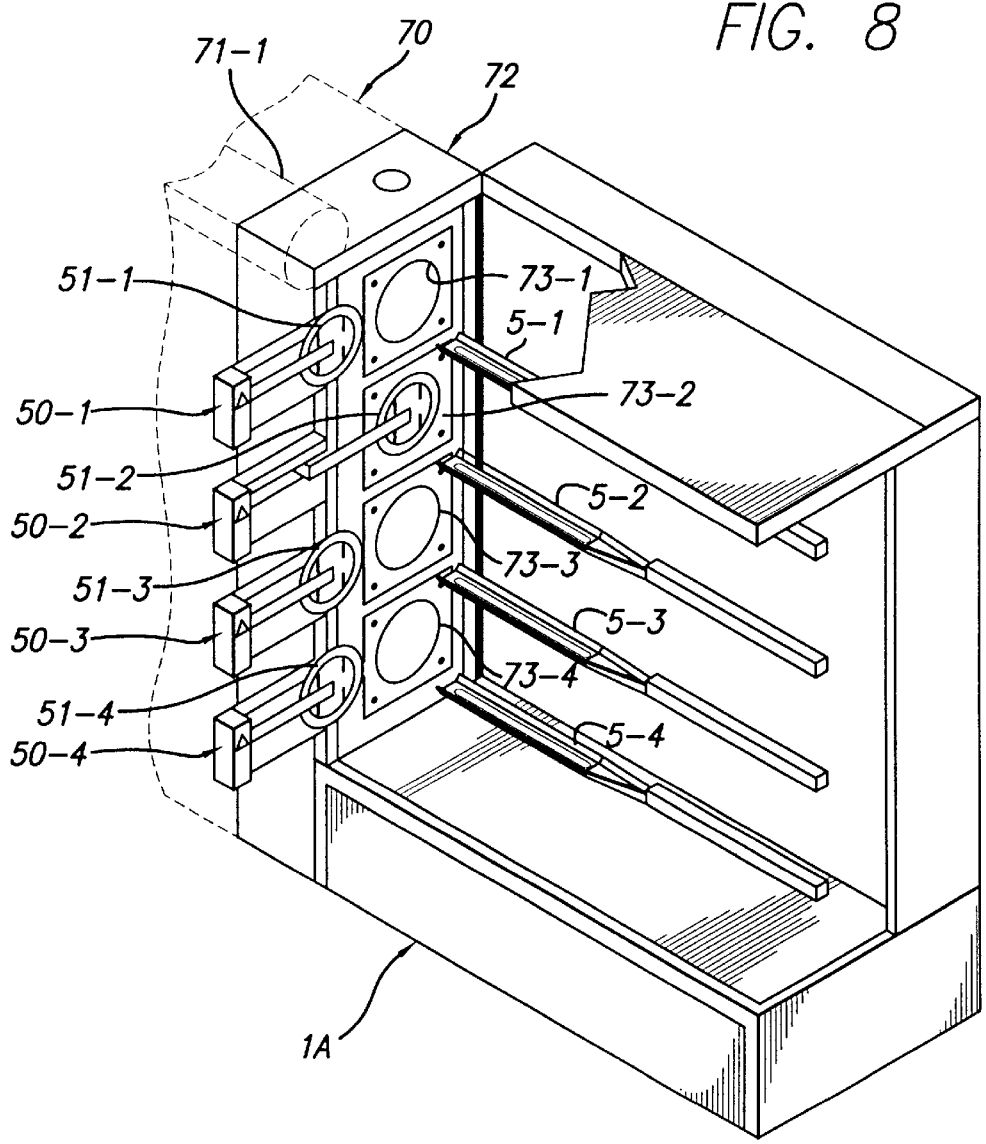
FIG. 8 is a partial perspective view of the four-level wafer boat loading apparatus of FIG. 1, adjacent to a scavenger attached to a four-level semiconductor processing furnace which is shown in dashed lines, with a plurality of the heat reflecting/blocking mechanisms of FIG. 6 attached to the scavenger.

Referring to FIG. 8, a partial perspective view of the wafer boat loading/unloading station 1A is shown in which the cantilever paddles 5 are shown but carriages 3 and tracks 4 are omitted for clarity of illustration. A multi-level furnace 70, partially shown in dashed lines, and the associated scavenger 72 attached thereto, are shown on the left side of wafer boat loading/unloading station 1A. The furnace 70 has four furnace tubes 71-1,2,3,4, but only furnace tube 71-1 is shown, for convenience.

As is conventional, the mouths of the four furnace tubes 71 each extend three or four inches into a conventional scavenger box 72, which functions to collect all of the toxic gases that flow out of the furnace tubes 71 so the gases can be safely exhausted from scavenger box 72. The right side of scavenger 72 has openings 73-1,2,3,4 through which the free ends of the cantilever paddles 5 can pass to carry the boatloads of the semiconductor wafers into the hot zones of the four furnace tubes 71, respectively. As mentioned above, the temperatures within the processing furnace tubes range from approximately 400 to approximately 1200 degrees Centigrade. To prevent excessive amounts of heat from escaping through the mouths of the furnace tubes and through the scavenger openings 73, after the scavenger openings 73 have been uncovered to allow loading/unloading of wafer boats into/from furnace tubes 71, movable heat reflectors 51 are automatically controlled so as to move them directly in front of the scavenger door openings 73 in order to shield the wafer boat loading region from heat that otherwise would flow out all of the open mouths of the furnace tubes 71 and the corresponding scavenger openings 73.

Still referring to FIG. 8, four automatic heat shield devices 50-1,2,3,4 are attached to the left face of scavenger box 72 adjacent to the scavenger openings 73-1,2,3,4, respectively, wherein the automatic heat shield device devices 50-1,3,4 have their heat reflector plates 51-1,3,4 in a retracted configuration, i.e., withdrawn from the corresponding openings 73 of scavenger box 72. However, automatic heat shield device 50-2 has its heat reflector plate 51-2 extended in front of scavenger opening 73-2 so as to reflect heat back into the furnace tube, and also to block flow of heat therefrom. Each of automatic heat shield devices 50 can be a device as shown in subsequently described FIG. 6. The four heat shield devices 50-1,2,3,4 operate in response to control signals produced by the limit switches 66-1,2,3,4, respectively in FIG. 1 so that whenever carriage mechanisms 3-1,2,3,4 are in their left-most "home" positions as shown in FIG. 1, heat shield devices 50-1,2,3,4 extend their respective heat reflector plates 51-1,2,3,4 over the corresponding scavenger openings 73-1,2,3,4, to thereby prevent excessive increase in the temperature in the vicinity of the four cantilever paddles 5-1,2,3,4, and thereby avoid exposure of maintenance personnel or operators to high temperatures.

Figure 6:
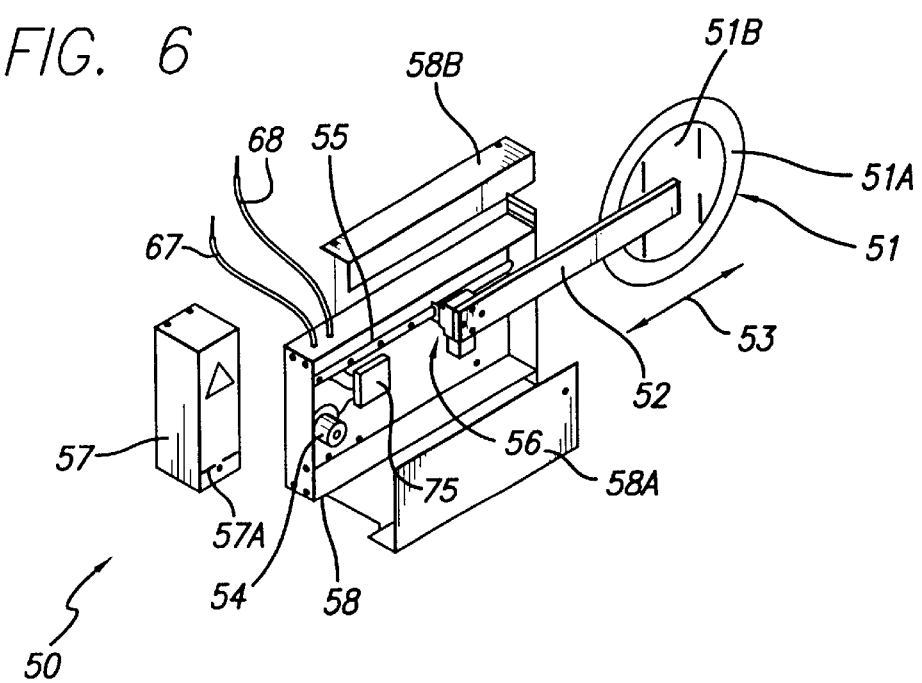
FIG. 6 is an exploded perspective view of an automatic heat reflecting/blocking mechanism for blocking heat from the mouth of a furnace tube during operation of the elevator system of the present invention.

Referring to FIG. 6, automatic heat shield device 50, which is shown in an exploded perspective view, includes a heat reflector plate 51 mounted on the end of a movable arm 52. Heat reflector plate 51 includes a reflector plate 51A supported by a plate 51B. Plates 51A and 51B are composed of suitable high temperature material, such as stainless steel. Arrows 53 indicate the movement of arm 52 to move reflective plate 51 outward to block heat from the opening 73 of a scavenger device 72 of furnace 70, and also to move the reflective plate 51 to a retracted position away from the scavenger opening 73 which allows loading/unloading of wafer boats into/from the furnace tube 71. Arm 52 is mounted on a movable carriage mechanism 56, which in turn is supported on and movable along a linear drive track 55 by means of a servo motorized linear belt drive mechanism 54. A control circuit 75 is included in housing 58 within which the linear track 55 and belt drive mechanism 54 are mounted. The housing 58 is covered by cover panels 57, 58A and 58B. The above mentioned controller in housing 58 receives control signals via conductors 67 and 68 from the corresponding limit switches 66-1,2,3,4 of FIG. 1, from a furnace controller (not shown), and from a manual override switch 57A mounted on cover 57. The first control signal 67 is produced by the corresponding limit switch 66 of FIG. 1 in response to the presence of the corresponding horizontally movable carriage 3 in a location wherein the corresponding horizontal cantilever paddle 5 supported by the horizontally movable carriage is fully withdrawn from the opening 73 of the scavenger device 72. The second control signal 68 is produced in response to the absence of the corresponding horizontally movable carriage 3 in the location wherein the horizontal cantilever paddle 5 supported by the horizontally movable carriage is fully withdrawn from the opening 73 of the scavenger device 72.

Thus, when each cantilever-paddle-supporting-carriage 3 leaves its leftmost "home" position, the corresponding automatic heat reflector 51 moves away from scavenger opening 73 to allow the cantilever paddle to enter into the corresponding furnace tube 71. When each cantilever-paddle-supporting-carriage 3 returns to its home position, the corresponding reflector 51 moves in front of the corresponding scavenger opening 73 to reflect heat back into the furnace tube 71 and prevent the temperature in the vicinity of the cantilever paddles from building up to an excessively high level.

FIG. 7 illustrates another similar automatic heat shield system in which the arm 52 supporting the heat reflective plate 51 is supported by a rotary, rather than linear, drive system including a servo motorized drive mechanism 61 mounted in a housing 54 along with a control system 61 and a cover 58.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

What is claimed is:

1. An apparatus for assisting the loading of a plurality of wafer boats through a scavenger device into a multi-level furnace including a vertical arrangement of horizontal furnace tubes, by means of a multi-level wafer boat loading system including a vertical arrangement of a plurality of horizontal cantilever paddles supported by a plurality of horizontally movable carriages movable along corresponding horizontal tracks, the apparatus comprising:

(a) a vertical elevator mechanism attached in fixed relationship to the wafer boat loading system;

(b) a horizontal wafer boat platform attached to a vertically movable carriage included in the elevator mechanism and vertically movable, in response to an electrical drive mechanism, along a linear track in the elevator mechanism to a selected elevation at which the wafer boats are to be manually transferred to an adjacent horizontal cantilever paddle;

(c) a control system associated with the vertical elevator mechanism and including a memory storing a program and a processor coupled to the memory for executing the program to control the elevation of the platform;

(d) the program being configured to store information representing a plurality of elevation levels of the wafer boat support platform adjacent to the plurality of cantilever paddles, respectively;

(e) the program also being configured to receive a selection signal corresponding to manual selection of one of the elevator levels and to control the electrical drive mechanism in response to the selection signal to move the wafer boat support platform from an initial position to the selected elevator level.

2. The apparatus of claim 1 wherein the program is configured to receive manually entered information representing a plurality of elevation levels and to store the plurality of elevation levels in the memory.

3. The apparatus of claim 1 wherein the control system includes a touch pad display screen adapted to display distinct touch pad areas corresponding to the elevation levels, respectively and produce the selection signal in response to pressing of one of the touch pad areas.

4. The apparatus of claim 1 wherein the program is configured to store information representing a home elevation of the wafer boat platform at a level which is convenient for manual placing of the wafer boats, loaded with semiconductor wafers, on the wafer boat support platform.

5. The apparatus of claim 4 wherein the program is configured to receive a home selection signal corresponding to manual selection of the home elevation.

6. The apparatus of claim 1 wherein the multi-level furnace includes a plurality of heat shield devices attached to the scavenger device, each including a heat reflector plate attached to a movable arm, the movable arm being attached to a carriage mechanism and movable in response to a drive mechanism, and a control system operable in response to a first control signal to advance the heat reflector plate in front of a corresponding opening of the scavenger device and into the mouth of a corresponding furnace tube, and also operable in response to a second control signal to withdraw the heat reflector plate from the mouth of the furnace tube and from the opening of the scavenger device to allow access to the interior of the furnace tube.

7. The apparatus of claim 6 including means for producing the first control signal in response to the presence of a corresponding horizontally movable carriage in a location wherein the horizontal cantilever paddle supported by the horizontally movable carriage is fully withdrawn from the opening of the scavenger device.

8. The apparatus of claim 7 including means for producing the second control signal in response to the absence of the corresponding horizontally movable carriage in the location wherein the horizontal cantilever paddle supported by the horizontally movable carriage is fully withdrawn from the opening of the scavenger device.

9. The apparatus of claim 1 including a pivot mechanism attached to the vertically movable carriage and the horizontal wafer boat platform to allow the horizontal wafer boat platform to be pivoted from a horizontal position to a vertical position when the horizontal wafer boat platform is not being used to support wafer boats.

10. A method for assisting the loading of a plurality of wafer boats through a scavenger device into a multi-level furnace including a vertical arrangement of horizontal furnace tubes, by means of a multi-level wafer boat loading system including a vertical arrangement of a plurality of horizontal cantilever paddles supported by a plurality of horizontally movable carriages movable along corresponding horizontal tracks, the method comprising:

(a) operating a control system of an automatic elevator system to move a horizontal wafer boat platform to a home level located at a convenient height above a floor to enable an operator to conveniently and safely load boatloads of semiconductor wafers onto the platform;

(b) manually loading a first boatload of wafers onto the platform while it is in the home position;

(c) manually actuating a control device to select a first level of a first cantilever paddle onto which the first boatload of wafers used to be loaded;

(d) operating the control system in response to the selection of the first level to cause the elevator system to raise the platform and first boatload of wafers thereon to the first level;

(e) the operator climbing a ladder adjacent to the platform at the first level and manually transferring the first boatload of wafers to the first cantilever paddle.

11. The method of claim 10 and wherein the first cantilever paddle is located at elevation which is too high for the operator to conveniently and safely load the first boatload wafers onto the first cantilever paddle while standing on the floor.

12. The method of claim 11 including repeating steps (a) through (e) to load a second boatload of wafers on the first cantilever paddle.

13. The method of claim 10 including repeating steps (a) through (e) for a second cantilever paddle located at a second level which is located at an elevation which is too high for the operator to conveniently and safely load the second boatload of wafers onto the second cantilever paddle while standing on the floor.

14. The method of claim 10 including controlling flow of heat from the interiors of a plurality of semiconductor processing furnace tubes of a multi-level furnace through a scavenger device into a portion of a multi-level wafer boat loading system, the multi-level furnace including a vertical arrangement of the furnace tubes, the method further including (a) providing a plurality of heat shield devices attached to the scavenger device, each including a heat reflector plate attached to a movable arm and a controller;

(b) operating the controller in response to a first control signal to advance the heat reflector plate in front of a corresponding opening of the scavenger device; and (c) operating the controller in response to a second control signal to withdraw the heat reflector plate from the corresponding opening of the scavenger device to allow access to the interior of the furnace tube.

15. The method of claim 14 including producing the first control signal in response to the presence of a corresponding horizontally movable carriage in a location wherein the horizontal cantilever paddle supported by the horizontally movable carriage is fully withdrawn from the opening of the scavenger device.

16. The method of claim 15 producing the second control signal in response to the absence of the corresponding horizontally movable carriage in the location wherein the horizontal cantilever paddle supported by the horizontally movable carriage is fully withdrawn from the opening of the scavenger device.

* * * * *